(12) United States Patent
Ahn et al.

(10) Patent No.: US 10,990,009 B2
(45) Date of Patent: Apr. 27, 2021

(54) PHOTORESIST COMPOSITION AND PHOTORESIST FILM USING THE SAME

(71) Applicant: LG CHEM, LTD., Seoul (KR)

(72) Inventors: Yongsik Ahn, Daejeon (KR); Yongmi Kim, Daejeon (KR); Minyoung Lim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 75 days.

(21) Appl. No.: 16/481,339

(22) PCT Filed: Nov. 20, 2018

(86) PCT No.: PCT/KR2018/014452
§ 371 (c)(1),
(2) Date: Jul. 26, 2019

(87) PCT Pub. No.: WO2019/103487
PCT Pub. Date: May 31, 2019

(65) Prior Publication Data
US 2020/0033727 A1    Jan. 30, 2020

(30) Foreign Application Priority Data
Nov. 24, 2017    (KR) .................. 10-2017-0158923

(51) Int. Cl.
G03F 7/028    (2006.01)
G03F 7/039    (2006.01)
G03F 7/033    (2006.01)
G03F 7/11     (2006.01)

(52) U.S. Cl.
CPC .............. *G03F 7/028* (2013.01); *G03F 7/033* (2013.01); *G03F 7/0392* (2013.01); *G03F 7/11* (2013.01); *C08F 2438/03* (2013.01)

(58) Field of Classification Search
CPC . G03F 7/0392; G03F 7/11; G03F 7/09; C08F 2438/03
See application file for complete search history.

(56) References Cited

U.S. PATENT DOCUMENTS

| | | | |
|---|---|---|---|
| 7,081,503 B2 | 7/2006 | Tsuji et al. | |
| 8,123,982 B2 | 2/2012 | Ward et al. | |
| 2005/0059787 A1 | 3/2005 | Benoit et al. | |
| 2005/0112495 A1 | 5/2005 | Feiring et al. | |
| 2005/0211957 A1 | 9/2005 | Ward et al. | |
| 2007/0232783 A1 | 10/2007 | Moad et al. | |
| 2009/0208873 A1 | 8/2009 | Harada et al. | |
| 2010/0137548 A1* | 6/2010 | Moad ................. | C08F 8/04 528/75 |
| 2012/0328983 A1 | 12/2012 | Kramer | |
| 2014/0114034 A1 | 4/2014 | Oshikiri et al. | |
| 2015/0268553 A1* | 9/2015 | Katayama ............ | G03F 7/0045 430/285.1 |
| 2015/0268557 A1 | 9/2015 | Irie et al. | |
| 2016/0004163 A1* | 1/2016 | Blakey ................ | C09D 153/00 430/17 |
| 2017/0037178 A1 | 2/2017 | Thackeray et al. | |

FOREIGN PATENT DOCUMENTS

| | | |
|---|---|---|
| CN | 1856741 A | 11/2006 |
| CN | 104211867 A | 12/2014 |
| CN | 103980417 B | 11/2016 |
| JP | 2007-256935 A | 10/2007 |
| JP | 2016-033637 A | 3/2016 |
| JP | 2017-036441 A | 2/2017 |
| KR | 10-2006-0095975 A | 9/2006 |
| KR | 10-2009-0088330 A | 8/2009 |
| KR | 10-2010-0073588 A | 7/2010 |
| KR | 10-2013-0001707 A | 1/2013 |
| KR | 10-2013-0112746 A | 10/2013 |
| KR | 10-2014-0001795 A | 1/2014 |
| KR | 10-2015-0110350 A | 10/2015 |
| KR | 10-2015-0123269 A | 11/2015 |
| WO | 2012-165473 A1 | 12/2012 |
| WO | 2017-057544 A1 | 4/2017 |

OTHER PUBLICATIONS

International Search Report & Written Opinion issued for International Application No. PCT/KR2018/014452 dated Mar. 3, 2019, 9 pages.

* cited by examiner

*Primary Examiner* — John A McPherson
*Assistant Examiner* — Nicholas E Brown
(74) *Attorney, Agent, or Firm* — Rothwell, Figg, Ernst & Manbeck, P.C.

(57) ABSTRACT

A photoresist composition capable of forming a pattern in which a footing phenomenon is suppressed while being highly sensitive during formation of a fine pattern on a metal surface substrate, and capable of producing a photoresist film that is excellent in chemical stability, and a photoresist film using the photoresist composition.

13 Claims, 1 Drawing Sheet

[FIG. 1]
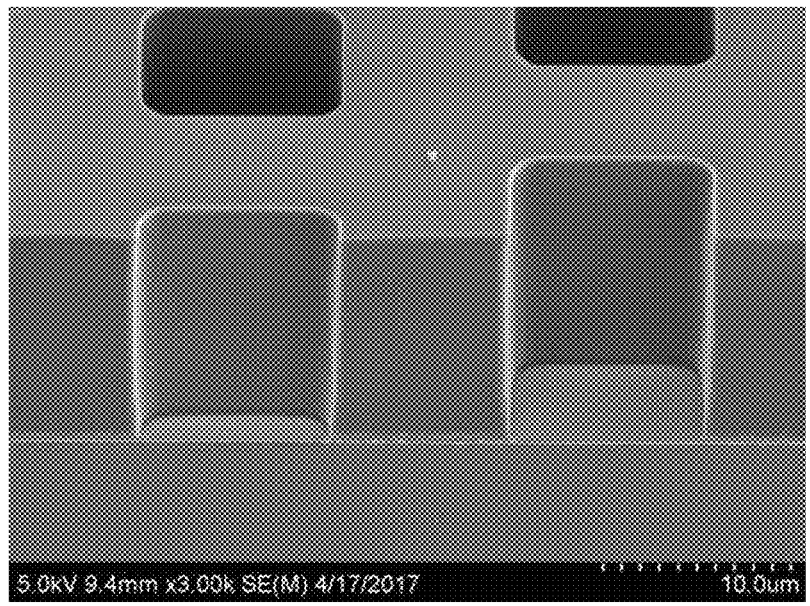
[FIG. 2]
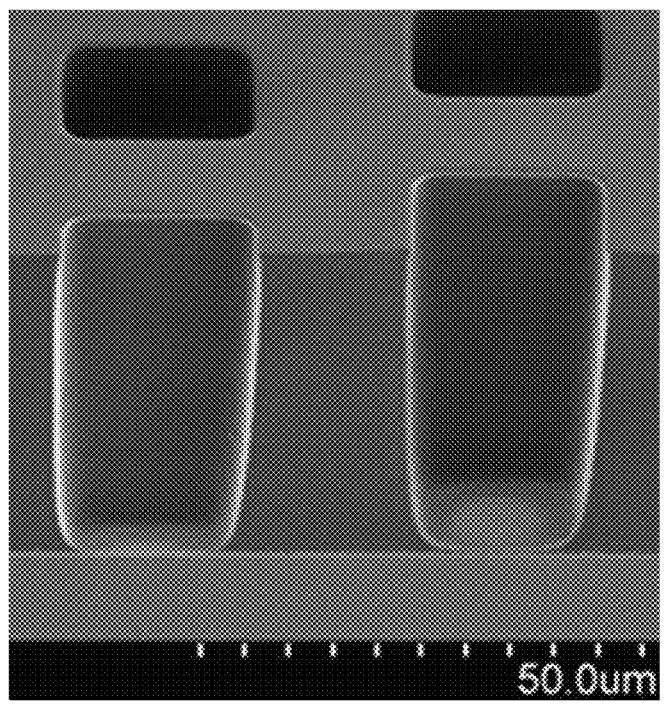

PHOTORESIST COMPOSITION AND PHOTORESIST FILM USING THE SAME

CROSS-REFERENCE TO RELATED APPLICATION(S)

This application is a 35 U.S.C. § 371 National Phase Entry Application from PCT/KR2018/014452, filed on Nov. 22, 2018, and designating the United States, which claims the benefit of the filing date of Korean Patent Application No. 10-2017-0158923 filed with Korean Intellectual Property Office on Nov. 24, 2017, the entire contents of which are incorporated herein by reference.

TECHNICAL FIELD

The present invention relates to a photoresist composition and a photoresist film using the same. More specifically, the present invention relates to a photoresist composition capable of producing a pattern in which a footing phenomenon is suppressed while being highly sensitive during formation of a fine pattern on a metal surface substrate, and of preparing a photoresist film having excellent chemical stability, and to a photoresist film using the same.

BACKGROUND ART

Photofabrication has become mainstream in a microfabrication technology, and packaging technology continues to change into a process for manufacturing high density packages.

In particular, with the increase of semiconductor input/output terminals, the use of flip chips has expanded and FOWLP (Fan-Out Wafer Level Packaging) technology is being introduced. Further the TSV (Through Silicon Via) process enabling direct connection between chips has expanded for the purpose of minimizing signal delay. In this regard, the demand for bumps has increased and the technical development of bump photoresists forming the same is considered to be very important.

In the case of a bump photoresist, (i) the sensitivity and resolution in a thick film ranging from 10 to 100 micrometers should be excellent, (ii) metal bumps should be formed through a plating process, such that pattern performance such as straightness, residue, footing, and notching properties should be good, and (iii) resistance to a plating solution should be excellent.

Accordingly, a chemically amplified photoresist is used in order to increase the sensitivity and resolution in a thick film. Generally, the above photoresist composition includes (a) a resin which is dissociated by an acid to increase its solubility in an alkali developing solution, (b) a photosensitive acid generator (photoacid generator), and (c) an acid diffusion control agent.

In the process of manufacturing bumps, bumps are formed by a method in which a photoresist hole pattern is first prepared through a lithographic process, and then a metal is filled inside the hole patterns through the plating process. Therefore, since a substrate having a metal surface such as Al, Cu, W, or the like is used as a base material for plating, the photoresist forms a pattern on a metal surface.

However, in the case of a photoresist obtained from a conventional chemically amplified photoresist composition, on the silicon or silicon oxide substrate, a vertical pattern can be formed in which the lower (substrate surface side) pattern and the upper (photoresist surface side) pattern have the same size. However, on the substrate having a metal surface, the substrate is not completely developed during pattern formation due to an interaction between an acid generated from the acid generator and the metal substrate, or the footing phenomenon occurs in the bottom of the pattern, and thereby there is a limitation in that it is difficult to obtain a vertical pattern of which the top and the bottom have the same CD.

To solve these problems, a method of adding a corrosion inhibitor to a photoresist composition has been proposed, but there are problems that manufacturing productivity of the resist composition is lowered, such as through solubility of the corrosion inhibitor being poor, the corrosion inhibitor being hardly dissolved, or the stirring time being prolonged, and further that the corrosion inhibitor contained in the resist pattern is dissolved in the plating solution during the plating process after the resist pattern is formed, thereby contaminating the plating solution.

In view of the above, there is a demand to develop a novel photoresist composition capable of forming a pattern which has no problems of non-development or residues, and remarkably reduces the footing phenomenon or does not cause any footing phenomenon, when forming patterns on the metal substrate.

DETAILED DESCRIPTION OF THE INVENTION

Technical Problem

It is an object of the present invention to provide a photoresist composition capable of forming patterns which have no problems of non-development or residues, and remarkably reducing the footing or not causing any footing, when forming patterns on the metal substrate using a chemically amplified photoresist composition.

It is another object of the present invention to provide a photoresist film using the above-mentioned photoresist composition.

Technical Solution

The present invention provides a photoresist composition for thick films used to form a photoresist pattern in which the footing phenomenon is minimized in the bottom of the pattern on a support having a metal surface, and to produce platings using the same, wherein the photoresist composition includes a first (meth)acrylic resin containing a (meth)acrylic backbone and a functional group represented by the following Chemical Formula 1 bonded to one end of the backbone; and a second (meth)acrylic resin containing a (meth)acrylic backbone and a thiol group bonded to one end of the backbone.

[Chemical Formula 1]

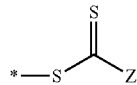

In Chemical Formula 1, Z is hydrogen, an alkyl group having 1 to 20 carbon atoms, an aryl group having 6 to 20 carbon atoms, an alkylthioxy group having 1 to 20 carbon atoms, an arylthioxy group having 6 to 20 carbon atoms, an alkoxy group having 1 to 20 carbon atoms, an aryloxy group having 6 to 20 carbon atoms, or an amine group having 1 to 20 carbon atoms.

The present invention also provides a photoresist film including a cured product of the photoresist composition of the one embodiment.

The present inventors found through experiments that when a photoresist composition obtained by mixing a first (meth)acrylic resin in which a functional group having a specific structure as represented by Chemical Formula 1 is bonded to one end of the (meth)acrylic backbone, together with a second (meth)acrylic resin in which a thiol functional group is bonded to one end of the (meth)acrylic backbone, is used, it is possible not only to produce a pattern which has no problems of non-development or residues that can remarkably decrease the footing or does not cause any footing even without adding another corrosion inhibitor, but also to achieve the effect of not contaminating the plating solution, even when the resist pattern is exposed to the plating solution, thereby completing the present invention.

In particular, the second (meth)acrylic resin can be easily introduced by a method of reacting the first (meth)acrylic resin with an amine or the like, and it appears that the effect of reducing the footing as described above is realized due to the thiol functional group present in the second (meth) acrylic resin.

In particular, the mixing ratio between the first (meth) acrylic resin and the second (meth)acrylic resin may be preferably from 1 mol % to 95 mol %, from 3 mol % to 50 mol %, or from 5 mol % to 30 mol %, based on the sum total of the first (meth)acrylic resin and the second (meth)acrylic resin. When the molar content of the second (meth)acrylic resin is excessively reduced to less than 1 mol %, the effect of improving the footing is insignificant. When the molar content of the second (meth)acrylic resin is excessively increased to more than 95 mol %, there is a problem that the exposure sensitivity is decreased due to addition of an excess amount of amine.

Hereinafter, the photoresist composition and the photoresist film according to specific embodiments of the present invention will be described in detail.

Throughout the specification, when one part "includes" one constituent element, unless otherwise specifically described, this does not mean that another constituent element is excluded, but means that another constituent element may be further included.

In the present invention, the term "(meth)acrylic" is used with the meaning of including acrylic or methacrylic.

In the present invention, examples of substituents are described below, but are not limited thereto.

As used herein, the term "substituted" means that other functional groups instead of a hydrogen atom in the compound are bonded, and a position to be substituted is not limited as long as the position is a position at which the hydrogen atom is substituted, that is, a position at which the substituent can be substituted, and when two or more are substituted, the two or more substituents may be the same as or different from each other.

As used herein, the term "substituted or unsubstituted" means being unsubstituted or substituted with one or more substituents selected from the group consisting of deuterium; a halogen group; a cyano group; a nitro group; a hydroxyl group; a carbonyl group; an ester group; an imide group; an amide group; an amino group; a carboxyl group; a sulfonic acid group; a sulfonamide group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an arylphosphine group; or a heterocyclic group containing at least one of N, O, and S atoms, or being unsubstituted or substituted with a substituent to which two or more substituents are linked among the substituents exemplified above. For example, "the substituent to which two or more substituents are linked" may be a biphenyl group. That is, the biphenyl group may also be an aryl group, and may be interpreted as a substituent to which two phenyl groups are linked.

As used herein, the notation

or ⸻* means a bond linked to another substituent group, and the direct bond means the case in which no separate atom is present at a part represented by L.

As used herein, the weight average molecular weight means a weight average molecular weight in terms of polystyrene measured by GPC method. In the process of determining the weight average molecular weight in terms of polystyrene measured by the GPC method, a commonly known analyzing device, a detector such as a refractive index detector, and an analytical column can be used. Commonly applied conditions for temperature, solvent, and flow rate can be used. Specific examples of the measurement conditions are as follows: a Waters PL-GPC220 instrument is used, Polymer Laboratories PLgel MIX-B, 300 mm column, is used at an evaluation temperature of 160° C., 1,2,4-trichlorobenzene is used as a solvent, the flow rate is 1 mL/min, a sample is prepared at a concentration of 10 mg/10 mL and then fed in an amount of 200 µL, and the value of Mw can be deter mined using calibration curves formed from a polystyrene standard. The molecular weight of the polystyrene standards used herein is nine kinds of 2000/10,000/30,000/70,000/200,000/700,000/2,000,000/4,000,000/10,000,000.

In the present invention, the alkyl group may be straight-chained or branched, and the number of carbon atoms thereof is not particularly limited, but is preferably 1 to 40. According to an exemplary embodiment, the number of carbon atoms of the alkyl group is 1 to 20. According to another exemplary embodiment, the number of carbon atoms of the alkyl group is 1 to 10. According to a further exemplary embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cycloheptylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethyl-propyl, isohexyl, 2-methylpentyl, 4-methylhexyl, 5-methylhexyl, and the like, but are not limited thereto.

In the present invention, the alkoxy group may be a straight-chain, branched-chain, or cyclic chain. The number of carbon atoms of the alkoxy group is not particularly limited, but is preferably 1 to 30. Specifically, examples thereof may include methoxy, ethoxy, n-propoxy, iso-propoxy, i-propyloxy, n-butoxy, isobutoxy, tert-butoxy, sec-butoxy, n-pentyloxy, neopentyloxy, isobutyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, or the like, but are not limited thereto.

In the present invention, the cycloalkyl group is not particularly limited, but the number of carbon atoms thereof is preferably 3 to 60, and it may be a monocyclic cycloalkyl group or a polycyclic cycloalkyl group. According to an exemplary embodiment, the number of carbon atoms of the cycloalkyl group is 3 to 30. According to another exemplary embodiment, the number of carbon atoms of the cycloalkyl group is 3 to 20. According to a further exemplary embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present invention, the amine group may be selected from the group consisting of —$NH_2$, a monoalkylamine group, a dialkylamine group, an N-alkylarylamine group, a monoarylamine group, a diarylamine group, an N-arylheteroarylamine group, an N-alkylheteroarylamine group, a monoheteroarylamine group, and a diheteroarylamine group, and the number of carbon atoms thereof is not particularly limited, but is preferably 1 to 30. Specific examples of the amine group may include, but are not limited to, a methylamine group, an ethylamine group, a diethylamine group, a phenylamine group, a naphthylamine group, a biphenylamine group, an anthracenylamine group, a 9-methyl-anthracenylamine group, a diphenylamine group, a ditolylamine group, an N-phenylbiphenylamine group, an N-phenylnaphthylamine group, an N-biphenylnaphthylamine group, an N-phenyltolylamine group, a triphenylamine group, an N-naphthylfluorenylamine group, an N-phenylphenanthrenylamine group, an N-biphenyl phenanthrenyl amine group, an N-phenylfluorenylamine group, an N-phenylterphenylamine group, an N-phenanthrenyl fluorenylamine group, a N-biphenylfluorenylamine group, or the like.

In the present invention, the N-alkylarylamine group means an amine group in which an alkyl group and an aryl group are substituted with N of the amine group.

In the present invention, the N-arylheteroarylamine group means an amine group in which an aryl group and a heteroaryl group are substituted with N of the amine group.

In the present invention, the N-alkylheteroarylamine group means an amine group in which an alkyl group and a heteroaryl group are substituted with N of the amine group.

In the present invention, the alkyl group in the monoalkylamine group, the dialkylamine group, the N-arylalkylamine group, and the alkylthioxy group is the same as the aryl group examples described above. Specifically, the alkylthioxy group includes a methylthioxy group, an ethylthioxy group, a tert-butylthioxy group, a hexylthioxy group, an octylthioxy group, and the like, but is not limited thereto.

In the present invention, the aryl group is not particularly limited, but the number of carbon atoms thereof is preferably 6 to 60, and the aryl group may be a monocyclic aryl group or a polycyclic aryl group. According to an exemplary embodiment, the number of carbon atoms of the aryl group is 6 to 30. According to another exemplary embodiment, the number of carbon atoms of the aryl group is 6 to 20. The monocyclic aryl group may be a phenyl group, a biphenyl group, a terphenyl group, or the like, but is not limited thereto. The polycyclic aryl group may be a naphthyl group, an anthracenyl group, a phenanthryl group, a pyrenyl group, a perylenyl group, a chrycenyl group, a fluorenyl group, or the like, but is not limited thereto.

In the present invention, the aryl group in the monoaryl amine group, the diaryl amine group, the aryloxy group, and the arylthioxy group is the same as the examples of the aryl group described above. Specifically, the aryloxy group includes a phenoxy group, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, and the arylthioxy group includes a phenylthioxy group, a 2-methylphenylthioxy group, a 4-tert-butylphenyloxy group, and the like, but is not limited thereto.

In the present invention, the alkylene group is a divalent functional group derived from an alkane, for example, a straight-chain, branched, or cyclic group, and examples thereof may be a methylene group, an ethylene group, a propylene group, an isobutylene group, a sec-butylene group, a tert-butylene group, a pentylene group, a hexylene group, and the like.

In the present invention, a direct bond means being connected to a bond line where no atoms or atomic groups exist at the corresponding position.

I. Photoresist Composition (1) Acrylic Resin

The photoresist composition of one embodiment of the invention is a photoresist composition for thick films used to form a photoresist pattern in which the footing phenomenon is minimized in the bottom of the pattern on a support having a metal surface, and to produce platings using the same, and may include a first (meth)acrylic resin containing a (meth)acrylic backbone and a functional group represented by Chemical Formula 1 bonded to one end of the backbone, and a second (meth)acrylic resin containing a (meth)acrylic backbone and a thiol group bonded to one end of the backbone.

The (meth)acrylic backbone means a polymer chain that can be formed through polymerization of a (meth)acrylic monomer such as (meth)acrylate or (meth)acrylic acid.

In the photoresist composition, the first (meth)acrylic resin and the second (meth)acrylic resin can act as a resin which is dissociated by an acid to increase solubility in an alkali developing solution (hereinafter referred to as an alkali developable resin) and simultaneously can act as a corrosion inhibitor which can suppress the footing phenomenon in the lower end of the pattern during the pattern formation of the photoresist film.

Consequently, the photoresist composition has features that, since it is not necessary to mix a separate corrosion inhibitor with the alkali-soluble resin, problems occurring during addition of the corrosion inhibitor (for example, the manufacturing productivity of the resist composition is lowered, such as solubility of the corrosion inhibitor being poor, the corrosion inhibitor being hardly dissolved, or the stirring time being prolonged, and further the corrosion inhibitor contained in the resist pattern is dissolved in the plating solution in the process of plating after formation of the resist pattern, thereby contaminating the plating solution) are solved, and also excellent developing sensitivity as an alkali developable resin can be realized.

That is, the photoresist composition may include an acrylic resin which includes a first (meth)acrylic resin containing a (meth)acrylic backbone and a functional group represented by Chemical Formula 1 bonded to one end of the backbone, and a second (meth)acrylic resin containing a (meth)acrylic backbone and a thiol group bonded to one end of the backbone. In addition, the photoresist composition may include an alkali-soluble resin which includes a first (meth)acrylic resin containing a (meth)acrylic backbone and a functional group represented by Chemical Formula 1 bonded to one end of the backbone, and a second (meth) acrylic resin containing a (meth)acrylic backbone and a thiol group bonded to one end of the backbone.

First, the first (meth)acrylic resin may contain a (meth) acrylic backbone and a functional group represented by the following Chemical Formula 1 bonded to one end of the backbone. The one end of the backbone may be any one of two ends located along the direction of chain extension of the backbone.

[Chemical Formula 1]

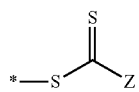

In Chemical Formula 1, Z is hydrogen, an alkyl group having 1 to 20 carbon atoms, an aryl group having 6 to 20 carbon atoms, an alkylthioxy group having 1 to 20 carbon atoms, an arylthioxy group having 6 to 20 carbon atoms, an alkoxy group having 1 to 20 carbon atoms, an aryloxy group having 6 to 20 carbon atoms, or an amine group having 1 to 20 carbon atoms.

More specifically, in Chemical Formula 1, Z may be an alkylthioxy group having 10 to 20 carbon atoms, preferably an alkylthioxy group having 12 carbon atoms.

A functional group represented by the following Chemical Formula 2 or a functional group containing a moiety derived from a polymerization initiator may be bonded to the other end of the (meth)acrylic backbone. The other end of the backbone may be an opposite end located along the direction of chain extension based on one end of the backbone.

[Chemical Formula 2]

In Chemical Formula 2, R is an alkylene group having 1 to 20 carbon atoms, and X is an alkyl group having 1 to 20 carbon atoms, or a carboxyl group. Specifically, in Chemical Formula 2, R may be an alkylene group having 1 to 5 carbon atoms substituted with a methyl group or a cyano group. More specifically, R may be one of the functional groups represented by the following Chemical Formulas 3 to 5.

[Chemical Formula 3]

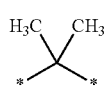

[Chemical Formula 4]

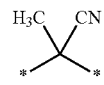

[Chemical Formula 5]

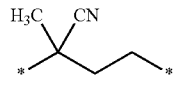

Preferably, (i) in Chemical Formula 2, R may be a functional group of Chemical Formula 3, and X may be a carboxyl group, (ii) in Chemical Formula 2, R may be a functional group of Chemical Formula 4, and X may be a methyl group, and (iii) in Chemical Formula 2, R may be a functional group of Chemical Formula 5, and X may be a carboxyl group.

In the moiety derived from the polymerization initiator, the "moiety" refers to a portion or a unit derived from a certain compound and included in a product of a chemical reaction when the certain compound takes part in the chemical reaction. By way of an example, the "moiety" of the polymerization initiator refers to a portion derived from a polymerization initiator or a decomposed polymerization initiator in a reaction product formed by a reaction between a polymerization initiator or a decomposed polymerization initiator and a (meth)acrylate. A specific example of the polymerization initiator includes azobisisobutyronitrile (AIBN).

Meanwhile, the (meth)acrylic backbone contained in the first (meth)acrylic resin may include a repeating unit represented by the following Chemical Formula 6.

[Chemical Formula 6]

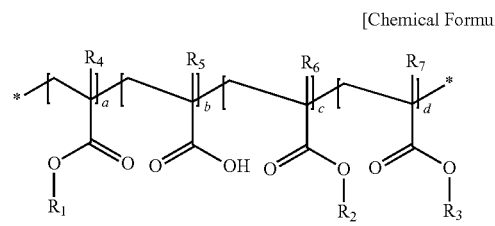

In Chemical Formula 6, $R_1$ is an alkyl group having 4 to 10 carbon atoms, preferably a tertiary alkyl group having 4 to 10 carbon atoms, $R_2$ is an alkyl group having 1 to 3 carbon atoms, or an alkyl group substituted with an alkoxy group having 3 to 10 carbon atoms, $R_3$ is an aryl group having 6 to 20 carbon atoms, or a cycloalkyl group having 3 to 20 carbon atoms, $R_4$ to $R_7$ are each independently hydrogen or a methyl group, and a ratio of a+c:b:d=2 to 8:0.5 to 3:1 to 5.

The cycloalkyl group having 3 to 20 carbon atoms is specifically a polycyclic cycloalkyl group, and may include a norbornane-based functional group. More specifically, the norbornane-based functional group may include a structure in which two adjacent substituents included in norbonane are bonded to each other to form a cycloalkyl group, and one hydrogen included in the norbornane is substituted with a direct bond.

More specifically, in Chemical Formula 6, $R_1$ is a tert-butyl group, $R_2$ is a methyl group or an ethyl group substituted with a methoxyethoxy, $R_3$ is a benzyl group or a functional group represented by the following Chemical Formula 9, $R_4$ to $R_7$ are each independently a methyl group, and a ratio of a+c:b:d=2 to 8:0.5 to 3:1 to 5.

[Chemical Formula 9]

As a non-limiting example, the (meth)acrylic backbone may be contained in an amount of 30 to 60% by weight of a repeating unit having a functional group dissociated by an acid in the molecule, which may be preferable for the formation of a stable pattern. Examples of the repeating unit having a functional group dissociated by an acid in the molecule may include a (meth)acrylate repeating unit containing $R_1$ at the branched chain end in Chemical Formula 6, or a (meth)acrylate repeating unit containing $R_2$ at the branched chain end in Chemical Formula 6.

For the purpose of preventing wettability with a plating solution or a developing solution, adhesion to a substrate, and occurrence of cracks, the (meth)acrylic backbone may preferably include 10 to 50% by weight of a repeating unit having a hydrophilic moiety.

In order to prevent cracking or swelling in the photoresist pattern during plating, the (meth)acrylic backbone contains preferably 10 to 50% by weight of a hydrophobic bulky repeating unit capable of imparting plating resistance. Examples of the hydrophobic bulky repeating unit include a (meth)acrylate repeating unit containing $R_3$ at the branched chain end in Chemical Formula 6.

In addition, in the formation of the (meth)acrylic backbone, a repeating unit having an acidic group or a hydroxyl group can be applied in an amount of 5 to 20% by weight, thereby controlling the sensitivity and the developing speed. As such a monomer, a compound in a form that is protected with a group deprotected by an acid is also applicable. Examples of the repeating unit having an acidic group or a hydroxyl group may include a (meth)acrylate repeating unit containing a carboxyl group at the branched chain end in Chemical Formula 6.

In addition, in the formation of the (meth)acrylic backbone, a monomer capable of controlling heat resistance and chemical resistance properties can be added.

Specifically, the first (meth)acrylic resin may be a polymer represented by the following Chemical Formula 7.

[Chemical Formula 7]

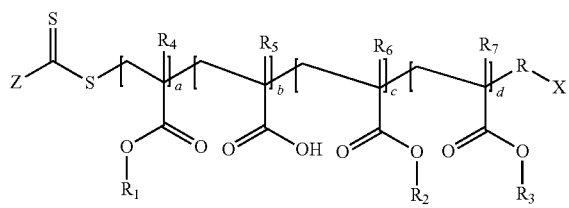

In Chemical Formula 7, Z is hydrogen, an alkyl group having 1 to 20 carbon atoms, an aryl group having 6 to 20 carbon atoms, an alkylthioxy group having 1 to 20 carbon atoms, an arylthioxy group having 6 to 20 carbon atoms, an alkoxy group having 1 to 20 carbon atoms, an aryloxy group having 6 to 20 carbon atoms, or an amine group having 1 to 20 carbon atoms, R is an alkylene group having 1 to 20 carbon atoms, X is an alkyl group having 1 to 20 carbon atoms, or a carboxyl group, $R_1$ is an alkyl group having 4 to 10 carbon atoms, $R_2$ is an alkyl group having 1 to 3 carbon atoms, or an alkyl group substituted with an alkoxy group having 3 to 10 carbon atoms, $R_3$ is an aryl group having 6 to 20 carbon atoms, or a cycloalkyl group having 3 to 20 carbon atoms, $R_4$ to $R_7$ are each independently hydrogen or a methyl group, and a ratio of a+c:b:d=2 to 8:0.5 to 3:1 to 5.

Specific examples of the polymer represented by Chemical Formula 7 may include Chemical Formula 11 of Preparation Example 1, Chemical Formula 13 of Preparation Example 3, or Chemical Formula 15 of Preparation Example 4.

Examples of the method of synthesizing the first (meth)acrylic resin are not particularly limited, but a method of reacting a chain transfer agent having a structure in which Chemical Formula 1 and Chemical Formula 2 are inter-linked, together with a mixture of (meth)acrylic monomers capable of forming the (meth)acrylic backbone, can be used.

Meanwhile, the second (meth)acrylic resin may include a (meth)acrylic backbone and a thiol group bonded to one end of the backbone.

The thiol group bonded to one end of the backbone can be introduced by reaction between a functional group represented by Chemical Formula 1 contained in the first (meth)acrylic resin and an amine compound. The details of the one end or (meth)acrylic backbone are the same as those described above with respect to the first (meth)acrylic resin.

The functional group represented by Chemical Formula 2 may also be bonded to the other end of the (meth)acrylic backbone of the second (meth)acrylic resin, and the details of the functional group represented by Chemical Formula 2 are the same as those described above with respect to the first (meth)acrylic resin.

Specifically, the second (meth)acrylic resin may be a polymer represented by the following Chemical Formula 8.

[Chemical Formula 8]

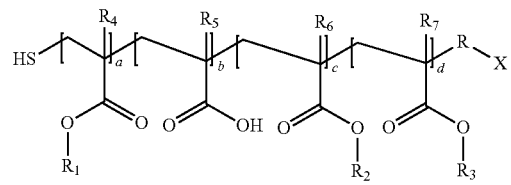

In Chemical Formula 8, R is an alkylene group having 1 to 20 carbon atoms, X is an alkyl group having 1 to 20 carbon atoms, or a carboxyl group, $R_1$ is an alkyl group having 4 to 10 carbon atoms, $R_2$ is an alkyl group having 1 to 3 carbon atoms or an alkyl group substituted with an alkoxy group having 3 to 10 carbon atoms, $R_3$ is an aryl group having 6 to 20 carbon atoms or a cycloalkyl group having 3 to 20 carbon atoms, $R_4$ to $R_7$ are each independently hydrogen or a methyl group, and a ratio of a+c:b:d=2 to 8:0.5 to 3:1 to 5.

Specific examples of the polymer represented by Chemical Formula 8 include a polymer of Chemical Formula 12 of Preparation Example 1, a polymer of Chemical Formula 14 of Preparation Example 3, or a polymer of Chemical Formula 16 of Preparation Example 4. The molar content of the second (meth)acrylic resin may be from 1 mol % to 95 mol %, from 3 mol % to 50 mol %, or from 5 mol % to 30 mol %, based on the sum total of the first (meth)acrylic resin and the second (meth)acrylic resin.

The mixed resin in which the first (meth)acrylic resin and the second (meth)acrylic resin are mixed may have a weight average molecular weight of 10,000 g/mol to 300,000 g/mol, 10,000 g/mol to 250,000 g/mol, or 12,000 g/mol to 200,000 g/mol, which may be advantageous for the formation of a stable pattern.

(2) Photoresist Composition

The photoresist composition of one embodiment of the invention may specifically be a positive type of photoresist composition for thick films or a photoresist composition for the formation of bumps. More specifically, the photoresist composition of one embodiment of the invention may be a photoresist composition for thick films used to form a photoresist pattern which the footing phenomenon is minimized in the bottom of the pattern on a support having a metal surface and to produce platings using the same.

The support having a metal surface may include a substrate having a metal layer formed on its surface, or a metal substrate. In the substrate having the metal layer formed on the surface thereof, examples of the substrate are not particularly limited, and various materials commonly known in the field of photoresist patterning, such as plastics, woods, semiconductor materials such as wafers, metals, and the like, can be applied without limitation.

The bottom of the pattern means the lower end of the photoresist pattern which is in contact with the support having the metal surface. When the value of the difference between a diameter of holes in the upper end of the photoresist pattern and a diameter of holes in the lower end thereof is a footing length, the footing phenomenon in the bottom of the pattern means that the footing length is more than 1 μm. The hole diameter at the end of the pattern may mean the maximum diameter of the cross-section taken in a direction parallel to the support, with respect to the via hole formed in the upper or lower end of the pattern, and the diameter of the cross-section can be measured through a SEM image.

The lower end of the pattern means a point at which the photoresist pattern is in contact with the support having the metal surface, and the upper end of the pattern may mean a point of the photoresist pattern farthest away from the support having the metal surface.

For example, the footing length can be measured as follows. The photoresist composition of one embodiment of the invention is spin-coated onto a copper (Cu) substrate so that the film thickness is 30 μm, dried on a hot plate at 110° C. for 2 minutes, exposed to light at 250 mJ/cm$^2$ using an i-line irradiation device (equipped with a photomask in which a hole pattern with a size of about 10, 20, 30, 40, and 50 μm is formed), additionally baked with a hot plate at 90° C. for 2 minutes, and developed in an about 2.38 wt % tetramethylammonium hydroxide (TMAH) aqueous solution for 3 minutes. The value of the difference between the diameter of holes in the upper end of the resist pattern thus produced and the diameter of holes in the lower end thereof can be measured as the footing length.

More specifically, as shown in FIG. 1, when there is almost no difference between the diameter of holes in the upper end of the photoresist pattern and the diameter of holes in the lower end thereof, the footing length is 1 μm or less, which means that the footing phenomenon is minimized. As shown in FIG. 2, the footing length, which is the difference between the diameter of holes in the upper end of the photoresist pattern and the diameter of holes in the lower end thereof, is more than 1 μm, which means that the footing phenomenon occurs sufficiently.

In the photoresist composition of one embodiment, an alkali-developable resin may be added if it is a polymer resin having an acid group protected by a protecting group, in addition to the first (meth)acrylic resin and the second (meth)acrylic resin. The acid group may be, for example, a carboxyl group, a phenolic hydroxyl group, or the like. As the alkali-developable resin, a polymer resin commonly known in the art can be used, and for example, it may be a hydroxystyrene resin or the like.

Preferably, the hydroxystyrene resin may be further included in an amount of 1 to 90 parts by weight, or 10 to 50 parts by weight, based on 100 parts by weight of the sum total of the first (meth)acrylic resin and the second (meth) acrylic resin.

Preferably, the hydroxystyrene resin may have a weight average molecular weight of 5000 g/mol to 20,000 g/mol, and may be a polyhydroxystyrene resin in which 20% to 60% is substituted with an acetal group.

The photoresist composition may further include various organic solvents or other additives widely known in the field of the photoresist, if necessary.

The organic solvent is included in order to uniformly dissolve and mix various components, and to control the viscosity of the photoresist composition. The organic solvent may be applied without particular limitation as long as it is known to be usable in a positive type of photoresist composition.

For example, the organic solvent may be one or more compounds selected from the group consisting of ethylene glycol monomethyl ether, ethylene glycol monoethyl ether, ethylene glycol monomethyl ether, ethylene glycol monoacetate, diethylene glycol, diethylene glycol monoethyl ether, diethylene glycol methyl ethyl ether, propylene glycol, propylene glycol monoacetate, propylene glycol methyl ether acetate, toluene, xylene, methyl ethyl ketone, methyl isoamyl ketone, cyclohexanone, dioxane, methyl lactate, ethyl lactate, methyl pyruvate, ethyl pyruvate, methyl methoxy propionate, ethyl ethoxy propionate, N,N-dimethylformamide, N,N-dimethylacetamide, N-methyl-2-pyrrolidone, 3-ethoxyethyl propionate, 2-heptanone, gamma-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxy-2-methylpropionate, ethyl 3-ethoxypropionate, ethyl 3-methoxy-2-methylpropionate, ethyl acetate, butyl acetate, and the like.

The organic solvent may be used in an amount of 5 to 500 parts by weight, 5 to 450 parts by weight, or 5 to 400 parts by weight, based on 100 parts by weight of the total amount of the resin components (the first (meth)acrylic resin and the second (meth)acrylic resin, and the other alkali-soluble resin). In other words, in order to ensure the applicability of the composition, the organic solvent is preferably contained in an amount of 5 parts by weight or more based on 100 parts by weight of the sum total of the resin components. However, when the organic solvent is added in an excess amount, the viscosity of the composition may be lowered and it may be difficult to adjust the thickness of the photoresist. Therefore, it is preferable that the organic solvent is included in an amount of 500 parts by weight or less based on 100 parts by weight of the sum total of the resin components.

Examples of the other additives may include a photoacid generator, an acid diffusion control agent, a plasticizer, a surfactant, a photoinitiator, a dissolution inhibitor, and the like. However, in the photoresist composition of the embodiment, as the first (meth)acrylic resin and the second (meth) acrylic resin are used in combination as described above, a separate corrosion inhibitor may not be used.

That is, the photoresist composition may contain less than 0.0001% by weight of a corrosion inhibitor including a triazine thiol compound or a triazole compound. The "less than 0.0001% by weight" means that the photoresist composition does not contain any corrosion inhibitor or contains it in a trace amount so as to not act as a corrosion inhibitor.

The photoacid generator, the acid diffusion control agent, the plasticizer, the surfactant, the photoinitiator, and the dissolution inhibitor may be applied without particular limitation as long as they can be commonly used for positive-type photoresist compositions in the technical field to which the present invention pertains.

The photoinitiator may be benzophenone, aromatic alpha-hydroxy ketone, benzyl ketal, aromatic alpha-amino ketone, phenylglyoxalic acid ester, mono-acylphosphine oxide, bis-acylphosphine oxide, tris-acylphosphine oxide, aromatic ketone-derived oxime ester, carbazole-based oxime ester, and the like.

The photoinitiator may be contained in an amount of 0.1 to 5 parts by weight based on 100 parts by weight of the sum total of the resin components, which is advantageous for expressing an appropriate effect of the photoinitiator.

The photoacid generator may be contained in an amount of 0.1 to 10 parts by weight, 0.5 to 10 parts by weight, or 1 to 5 parts by weight based on 100 parts by weight of the sum total of the resin components.

That is, in order to sufficiently express the above-described photoacid generating effect, the photoacid generator is preferably contained in an amount of 0.1 parts by weight or more based on 100 parts by weight of the total amount of the resin component. However, when the photoacid generator is added in an excess amount, the photosensitivity of the composition may deviate from an appropriate level, and scum may remain in the exposed part after development. Therefore, it is preferable that the photoacid generator is contained in an amount of 10 parts by weight or less based on 100 parts by weight of the sum total of the resin components.

The surfactant may be contained in an amount of 0.01 to 1 part by weight, 0.05 to 1 part by weight, or 0.05 to 0.5 parts by weight based on 100 parts by weight of the total amount of the resin component. When the surfactant is added in an excess amount, the wettability and flatness of the composition with respect to the substrate may deviate from an appropriate level. Therefore, the surfactant is preferably contained in an amount of 1 part by weight or less based on 100 parts by weight of the sum total of the resin components.

The acid diffusion control agent may be included for improving the resist pattern shape, stability after exposure, etc., and for example, it may be at least one selected from the group consisting of triethylamine, tripropyl amine, tribenzyl amine, trihydroxyethyl amine, and ethylene diamine.

II. Photoresist Film

On the other hand, according to another embodiment of the present invention, a photoresist film including a cured product of the photoresist composition of one embodiment may be provided.

More specifically, the photoresist film can be obtained by a method for preparing a photoresist film including the steps of applying and drying the photoresist composition of one embodiment, and then exposing and developing the photoresist composition to form a photoresist film.

As a more specific example, a method for preparing the photoresist film is as follows. The photoresist composition of one embodiment of the invention is spin-coated onto a copper (Cu) substrate and dried at 110° C. for 2 minutes to form a photoresist layer having a thickness of about 30 μm. Subsequently, the substrate is exposed to light using an i-line irradiation device (equipped with a photomask in which a hole pattern with a size of about 10, 20, 30, 40, and 50 μm is formed). The exposed substrate is baked at 90° C. for 2 minutes, and then the substrate is developed using a developing solution (about 2.38 wt % tetramethylammonium hydroxide aqueous solution) for 3 minutes.

In the photoresist film of the other embodiment, the footing phenomenon in the bottom of the pattern is minimized at the time of pattern formation, and there is no fear that the corrosion inhibitor is dissolved in the plating solution during the plating process, thereby preventing contamination of the plating solution.

Advantageous Effects

According to the present invention, a photoresist composition capable of forming a pattern in which the footing phenomenon is suppressed while being highly sensitive during formation of a fine pattern on a metal surface substrate, and of producing a photoresist film excellent in chemical stability, and a photoresist film using the same, can be provided.

BRIEF DESCRIPTION OF THE DRAWINGS

FIG. 1 shows the results of the measurement of the footing in the photoresist pattern obtained in Example 1.

FIG. 2 shows the results of the measurement of the footing in the photoresist pattern obtained in Comparative Example 1.

DETAILED DESCRIPTION OF THE EMBODIMENTS

The invention will be described in more detail by way of the examples provided below. However, the following examples are given for illustrative purposes only, and the scope of the present invention is not intended to be limited to or by these examples.

PREPARATION EXAMPLES: PREPARATION OF ACRYLIC RESIN

Preparation Example 1

Tert-butyl methacrylate, (2-methoxyethoxy)ethylmethacrylate, 5-methacryloyloxy 2,3-trimethylene norbornane, and methacrylic acid were mixed at a weight ratio of 30/20/40/10, and a total amount (500 g) of acrylate monomers, 500 g of PGMEA, and 10 g of 2-(dodecylthiocarbonothioylthio)-2-methylpropionic acid represented by the following Chemical Formula A as a chain transfer agent were stirred. After the temperature was raised to 80° C., 5 g of AIBN was added as a polymerization initiator, and stirred for 18 hours and maintained at that temperature to synthesize an acrylic polymer represented by the following Chemical Formula 11.

[Chemical Formula A]

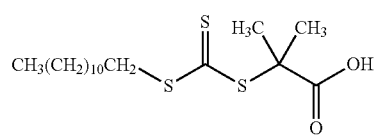

-continued

[Chemical Formula 11]

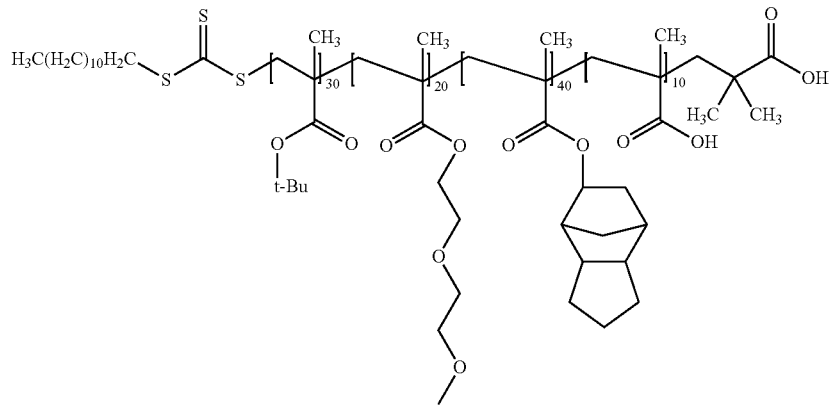

Subsequently, cyclohexylamine was added to the synthesized acrylic polymer in an amount of 5 mol % relative to the addition amount of the chain transfer agent, and then reacted at 60° C. for 24 hours. Thereby, the acrylic resin of Preparation Example 1 in which 95 mol % of the acrylic polymer of Chemical Formula 11 and 5 mol % of the acrylic polymer of Chemical Formula 12 were mixed was prepared. (Weight average molecular weight measured by GPC: 15,700 g/mol).

[Chemical Formula 12]

Preparation Example 2

An acrylic resin of Preparation Example 2 in which 70 mol % of the acrylic polymer of Chemical Formula 11 and 30 mol % of the acrylic polymer of Chemical Formula 12 were mixed, was prepared in the same manner as in Preparation Example 1, except that cyclohexylamine was added to the synthesized acrylic polymer in an amount of 30 mol % relative to the addition amount of the chain transfer agent. (Weight average molecular weight measured by GPC: 15,500 g/mol)

Preparation Example 3

An acrylic resin of Preparation Example 3 in which 95 mol % of the acrylic polymer of Chemical Formula 13 and 5 mol % of the acrylic polymer of Chemical Formula 14 were mixed, was prepared in the same manner as in Preparation Example 1, except that 2-cyano-2-propyl dodecyl trithiocarbonate represented by the following Chemical Formula B was used instead of 2-(dodecylthiocarbonothioyl-thio)-2-methylpropionic acid represented by Chemical Formula A as a chain transfer agent. (Weight average molecular weight measured by GPC: 14,500 g/mol)

[Chemical Formula B]

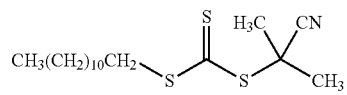

[Chemical Formula 13]

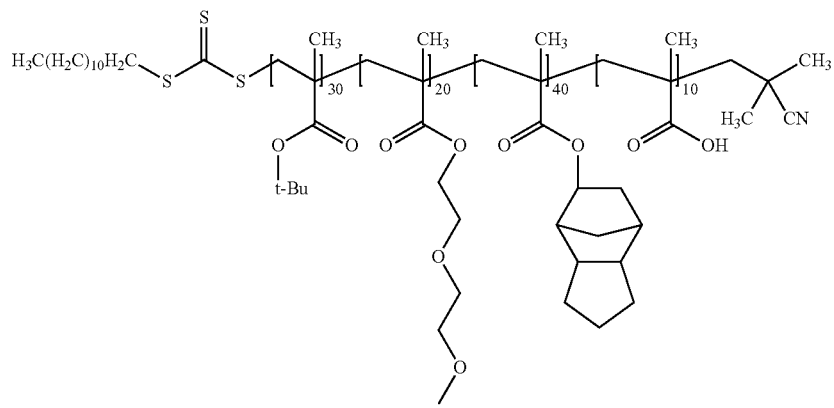

-continued

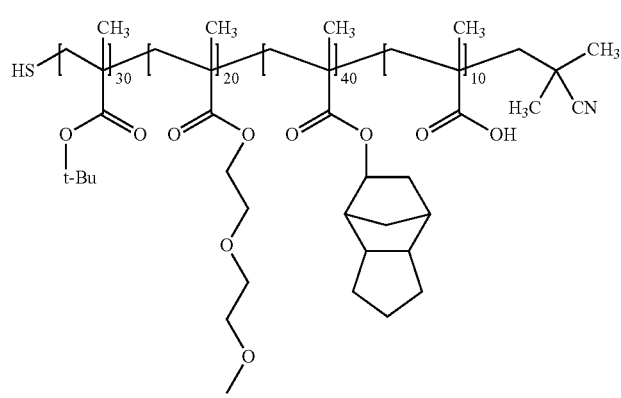

Preparation Example 4

An acrylic resin of Preparation Example 4 in which 95 mol % of the acrylic polymer of Chemical Formula 15 and 5 mol % of the acrylic polymer of Chemical Formula 16 were mixed, was prepared in the same manner as in Preparation Example 1, except that 4-cyano-4-[(dodecylsulfanyl-thiocarbonyl)sulfanyl]pentanoic acid represented by the following Chemical Formula C was used instead of 2-(dodecylthiocarbonothioylthio)-2-methylpropionic acid represented by Chemical Formula A as a chain transfer agent. (Weight average molecular weight measured by GPC: 16100 g/mol)

[Chemical Formula C]

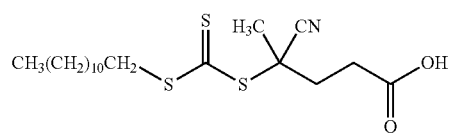

[Chemical Formula 15]

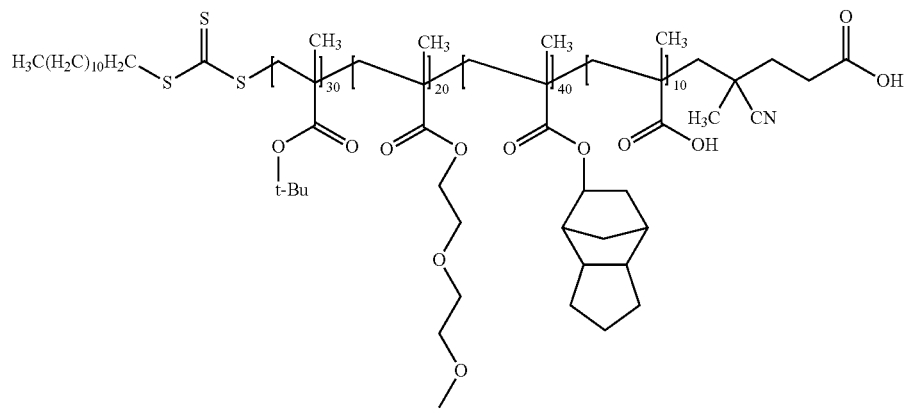

[Chemical Formula 16]

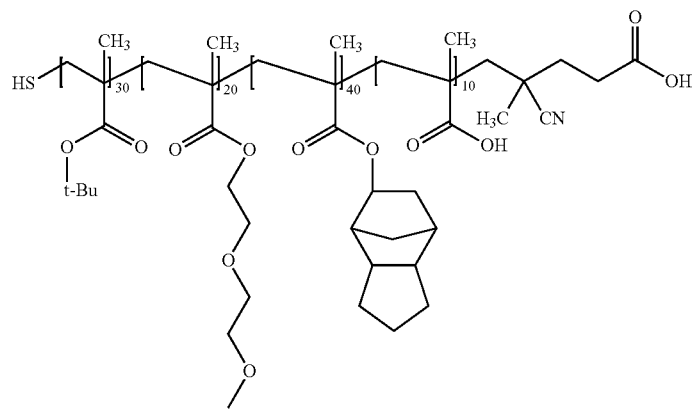

COMPARATIVE PREPARATION EXAMPLES: PREPARATION OF ACRYLIC RESIN

Comparative Preparation Example 1

An acrylic resin of Comparative Preparation Example 1 was prepared in the same manner as in Preparation Example 1, except that 2-(dodecylthiocarbonothioylthio)-2-methylpropionic acid represented by Chemical Formula A was not used as a chain transfer agent, and cyclohexylamine was not treated.

Comparative Preparation Example 2

An acrylic resin of Comparative Preparation Example 2 was prepared in the same manner as in Preparation Example 1, except that 1-dodecanethiol was used instead of 2-(dodecylthiocarbonothioylthio)-2-methylpropionic acid represented by Chemical Formula A as a chain transfer agent, and cyclohexylamine was not treated.

Comparative Preparation Example 3

An acrylic resin of Comparative Preparation Example 3 containing only 100 mol % of the acrylic polymer represented by Chemical Formula 11 obtained in Preparation Example 1 was prepared in the same manner as in Preparation Example 1, except that cyclohexylamine was not added to the acrylic polymer represented by Chemical Formula 11.

EXAMPLES AND COMPARATIVE EXAMPLES: PREPARATION OF PHOTORESIST COMPOSITION

The components shown in Table 1 below were mixed to prepare photoresist compositions of each of examples and comparative examples.

Specifically, the specific components used in Table 1 are as follows.

Other resin: Acetal protected polyhydroxystyrene (PHS) resin (Mw 15,300 g/mol, substitution rate 40%)

Photoacid generator: PAI 101 (α-[(4-toluenesulfonyloxy-imino)](4-methoxyphenyl) acetonitrile)

Acid diffusion control agent: n-tributylamine

Organic solvent: Propylene glycol methyl ether acetate (PGMEA)

Corrosion inhibitor: benzotriazole (BTA)

TABLE 1

| Category (unit: g) | Acrylic resin Type | Acrylic resin Addition amount | Other resin | Photoacid generator | Acid diffusion control agent | Corrosion inhibitor | Organic solvent |
|---|---|---|---|---|---|---|---|
| Example 1 | Preparation Example1 | 120 | 40 | 2 | 0.06 | — | 40 |
| Example 2 | Preparation Example2 | 120 | 40 | 2 | 0.06 | — | 40 |
| Example 3 | Preparation Example3 | 120 | 40 | 2 | 0.06 | — | 40 |
| Example 4 | Preparation Example4 | 120 | 40 | 2 | 0.06 | — | 40 |
| Comparative Example 1 | Comparative Preparation Example1 | 120 | 40 | 2 | 0.06 | — | 40 |
| Comparative Example 2 | Comparative Preparation Example2 | 120 | 40 | 2 | 0.06 | — | 40 |
| Comparative Example 3 | Comparative Preparation Example2 | 120 | 40 | 2 | 0.06 | 0.3 | 40 |
| Comparative Example 4 | Comparative Preparation Example3 | 120 | 40 | 2 | 0.6 | — | 40 |

EXPERIMENTAL EXAMPLE

The physical properties of the photoresist composition were evaluated by the following methods using the respective photoresist compositions according to the examples and comparative examples, and the results are shown in Table 2 below.

(1) Footing in the Bottom of the Pattern

The photoresist composition prepared in the examples and comparative examples were spin-coated onto a copper (Cu) substrate so that the film thickness was 30 μm, dried on a hot plate at 110° C. for 2 minutes, exposed to light at 250 mJ/cm$^2$ using an i-line irradiation device (equipped with a photomask in which a hole pattern with a size of about 10, 20, 30, 40, and 50 μm was formed), additionally baked with a hot plate at 90° C. for 2 minutes, and developed in an about 2.38 wt % tetramethylammonium hydroxide (TMAH) aqueous solution for 3 minutes to prepare a resist pattern.

The value of the difference between the diameter of holes in the top of the resist pattern and the diameter of holes in the bottom thereof was measured as the footing length, and was evaluated based on the following criteria.

⊚: Footing length of more than 0 nm and no more than 500 nm

○: Footing length of more than 500 nm and not more than 1 μm

Δ: Footing length of more than 1 μm and not more than 2 μm

X: Footing length of more than 2 μm

In addition, the result of measurement of the footing (FE-SEM (Hitachi, S-4800)) of Example 1 is shown in FIG. 1, and the result of measurement of the footing (FE-SEM (Hitachi, S-4800)) of Comparative Example 1 is shown in FIG. 2.

(2) Whether or not Plating Solutions Contaminated

After the resist pattern prepared in Experimental Example 1 was immersed in an AnAg plating solution for 2 hours, the components contained in the AnAg plating solution were analyzed by UV-Vis equipment to determine whether or not benzotriazole component was detected. The contamination of the plating solution was evaluated based on the following criteria.

Good: No benzotriazole detected
Poor: Benzotriazole detected

TABLE 2

|  | Footing | Contamination of plating solution |
|---|---|---|
| Example 1 | ⊚ (250 nm) | Good |
| Example 2 | ⊚ (150 nm) | Good |
| Example 3 | ⊚ (230 nm) | Good |
| Example 4 | ⊚ (240 nm) | Good |
| Comparative Example 1 | X (4.5 μm) | Good |
| Comparative Example 2 | X (3.7 μm) | Good |
| Comparative Example 3 | ⊚ (240 nm) | Poor |
| Comparative Example 4 | Δ (1.5 μm) | Good |

Referring to Table 2, it was confirmed that in the case of the photoresist compositions according to the examples, even while the footing in the lower end of the pattern was hardly generated, no contamination was generated in the plating solution since a corrosion inhibitor was not contained as an additive in the composition.

On the other hand, it was confirmed that in the case of the photoresist compositions of Comparative Examples 1 and 2, since the specific acrylic resin obtained in the preparation examples was not included, the footing length was increased and thus it was difficult to produce a resist pattern suitable for bump formation.

In particular, it was confirmed that when the two types of acrylic polymers were mixed as in the examples, the footing length in the bottom of pattern was greatly reduced, thereby producing an optimum resist pattern for bump formation, as compared with the case where only one type of acrylic polymer was present without adding cyclohexylamine as in Comparative Example 4.

In addition, it was confirmed that in the case of the photoresist composition of Comparative Example 3, as the corrosion inhibitor was added to the composition separately from the resin, the corrosion inhibitor was eluted into the plating liquid during the plating process and there was a limitation in that the plating solution was contaminated.

The invention claimed is:

1. A photoresist composition for thick films to form a photoresist pattern on a support having a metal surface, comprising:
a first (meth)acrylic resin containing a (meth)acrylic backbone and a functional group represented by the following Chemical Formula 1 bonded to one end of the backbone, and
a second (meth)acrylic resin containing a (meth)acrylic backbone and a thiol group bonded to one end of the backbone:

[Chemical Formula 1]

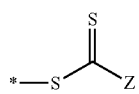

wherein, in Chemical Formula 1,
Z is hydrogen, an alkyl group having 1 to 20 carbon atoms, an aryl group having 6 to 20 carbon atoms, an alkylthioxy group having 1 to 20 carbon atoms, an arylthioxy group having 6 to 20 carbon atoms, an alkoxy group having 1 to 20 carbon atoms, an aryloxy group having 6 to 20 carbon atoms, or an amine group having 1 to 20 carbon atoms,
wherein the photoresist composition is capable of minimizing a footing in the bottom of the photoresist pattern.

2. The photoresist composition according to claim 1, wherein Z is an alkylthioxy group having 10 to 20 carbon atoms.

3. The photoresist composition according to claim 1, wherein the first (meth)acrylic resin and the second (meth)acrylic resin comprises a functional group represented by the following Chemical Formula 2 or a functional group containing a moiety derived from a polymerization initiator that is bonded to the other end of the (meth)acrylic backbone:

[Chemical Formula 2]

wherein, in Chemical Formula 2,
R is an alkylene group having 1 to 20 carbon atoms, and
X is an alkyl group having 1 to 20 carbon atoms, or a carboxyl group.

4. The photoresist composition according to claim 3, wherein, in Chemical Formula 2, R is an alkylene group having 1 to 5 carbon atoms substituted with a methyl group or a cyano group.

5. The photoresist composition according to claim 4, wherein, in Chemical Formula 2, R is one of functional groups represented by the following Chemical Formulas 3 to 5:

[Chemical Formula 3]

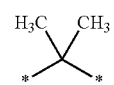

[Chemical Formula 4]

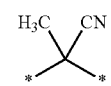

[Chemical Formula 5]

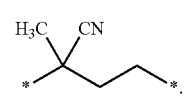

6. The photoresist composition according to claim 1, wherein the (meth)acrylic backbone contained in the first (meth)acrylic resin includes a repeating unit represented by the following Chemical Formula 6:

[Chemical Formula 6]

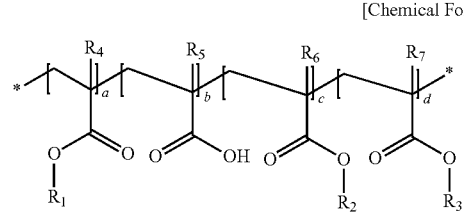

wherein, in Chemical Formula 6, $R_1$ is an alkyl group having 4 to 10 carbon atoms, $R_2$ is an alkyl group having 1 to 3 carbon atoms, or an alkyl group substituted with an alkoxy group having 3 to 10 carbon atoms, $R_3$ is an aryl group having 6 to 20 carbon atoms, or a cycloalkyl group having 3 to 20 carbon atoms, $R_4$ to $R_7$ are each independently hydrogen or a methyl group, and a ratio of a+c:b:d=2 to 8:0.5 to 3:1 to 5.

7. The photoresist composition according to claim 1, wherein the first (meth)acrylic resin is a polymer represented by the following Chemical Formula 7:

[Chemical Formula 7]

![Chemical Formula 7 structure]

wherein, in Chemical Formula 7,

Z is hydrogen, an alkyl group having 1 to 20 carbon atoms, an aryl group having 6 to 20 carbon atoms, an alkylthioxy group having 1 to 20 carbon atoms, an arylthioxy group having 6 to 20 carbon atoms, an alkoxy group having 1 to 20 carbon atoms, an aryloxy group having 6 to 20 carbon atoms, or an amine group having 1 to 20 carbon atoms, R is an alkylene group having 1 to 20 carbon atoms, X is an alkyl group having 1 to 20 carbon atoms, or a carboxyl group, $R_1$ is an alkyl group having 4 to 10 carbon atoms, $R_2$ is an alkyl group having 1 to 3 carbon atoms, or an alkyl group substituted with an alkoxy group having 3 to 10 carbon atoms, $R_3$ is an aryl group having 6 to 20 carbon atoms, or a cycloalkyl group having 3 to 20 carbon atoms, $R_4$ to $R_7$ are each independently hydrogen or a methyl group, and a ratio of a+c:b:d=2 to 8:0.5 to 3:1 to 5.

8. The photoresist composition according to claim 1, wherein the second (meth)acrylic resin is a polymer represented by the following Chemical Formula 8:

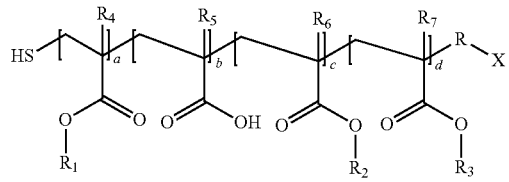

[Chemical Formula 8]

wherein, in Chemical Formula 8,

R is an alkylene group having 1 to 20 carbon atoms,

X is an alkyl group having 1 to 20 carbon atoms, or a carboxyl group, $R_1$ is an alkyl group having 4 to 10 carbon atoms, $R_2$ is an alkyl group having 1 to 3 carbon atoms, or an alkyl group substituted with an alkoxy group having 3 to 10 carbon atoms, $R_3$ is an aryl group having 6 to 20 carbon atoms or a cycloalkyl group having 3 to 20 carbon atoms, $R_4$ to $R_7$ are each independently hydrogen or a methyl group, and a ratio of a+c:b:d=2 to 8:0.5 to 3:1 to 5.

9. The photoresist composition according to claim 1, wherein an amount of the second (meth)acrylic resin is from 10 mol % to 30 mol %, based on a total amount of the first (meth)acrylic resin and the second (meth)acrylic resin.

10. The photoresist composition according to claim 1, further comprising a hydroxystyrene resin in an amount of 1 to 90 parts by weight, based on 100 parts by weight of a sum total of the first (meth)acrylic resin and the second (meth)acrylic resin.

11. The photoresist composition according to claim 1, further comprising at least one additive selected from the group of a photoacid generator, an acid diffusion control agent, a plasticizer, a surfactant, a photoinitiator, and a dissolution inhibitor.

12. The photoresist composition according to claim 1, wherein the photoresist composition contains less than 0.0001% by weight of a corrosion inhibitor including a triazine thiol compound or a triazole compound.

13. A photoresist film comprising a cured product of the photoresist composition of claim 1.

* * * * *